United States Patent
Kolis et al.

(10) Patent No.: US 9,493,887 B1
(45) Date of Patent: Nov. 15, 2016

(54) HETEROGENEOUS SINGLE VANADATE BASED CRYSTALS FOR Q-SWITCHED LASERS AND MICROLASERS AND METHOD FOR FORMING SAME

(71) Applicant: Clemson University, Clemson, SC (US)

(72) Inventors: Joseph W. Kolis, Central, SC (US); Colin D. McMillen, Liberty, SC (US); J. Matthew Mann, Anderson, SC (US)

(73) Assignee: Clemson University Research Foundation, Clemson, SC (US)

( * ) Notice: Subject to any disclaimer, the term of this patent is extended or adjusted under 35 U.S.C. 154(b) by 293 days.

(21) Appl. No.: 14/497,949

(22) Filed: Sep. 26, 2014

Related U.S. Application Data

(62) Division of application No. 12/832,115, filed on Jul. 8, 2010, now abandoned.

(51) Int. Cl.
    *C30B 7/10*      (2006.01)
    *C30B 7/00*      (2006.01)

(52) U.S. Cl.
    CPC .. *C30B 7/10* (2013.01); *C30B 7/00* (2013.01)

(58) Field of Classification Search
    CPC .............. C30B 9/00; C30B 7/00; C30B 7/10
    See application file for complete search history.

(56) References Cited

U.S. PATENT DOCUMENTS

| | | | |
|---|---|---|---|
| 3,505,239 | A | 4/1970 | Mazelsky et al. |
| 4,305,778 | A | 12/1981 | Gier et al. |
| 5,066,356 | A | 11/1991 | Ferretti et al. |
| 5,119,382 | A | 6/1992 | Kennedy et al. |
| 5,394,413 | A | 2/1995 | Zayhowski |
| 5,441,803 | A | 8/1995 | Meissner |
| 5,495,494 | A | 2/1996 | Molva et al. |
| 5,502,737 | A | 3/1996 | Chartier et al. |
| 5,563,899 | A | 10/1996 | Meissner et al. |
| 5,761,233 | A | 6/1998 | Bruesselbach et al. |
| 5,846,638 | A | 12/1998 | Meissner |
| 6,025,060 | A | 2/2000 | Meissner |
| 6,347,109 | B1 | 2/2002 | Beach et al. |
| 6,834,070 | B2 | 12/2004 | Zapata |

(Continued)

FOREIGN PATENT DOCUMENTS

EP      0065382 A1      11/1982

OTHER PUBLICATIONS

Armstrong et al., "Novel composite structure Nd:YAG gain media for high power scaling of side-pumped configurations", *Optics Communications*, (2000), 175, pp. 201-207.

(Continued)

*Primary Examiner* — Robert M Kunemund
(74) *Attorney, Agent, or Firm* — Dority & Manning, P.A.

(57) ABSTRACT

Disclosed are heterogeneous crystals for use in a laser cavity and methods of forming the crystals. A crystal can be a monolithic crystal containing a vanadate-based activator region and a vanadate-based Q-switch. Disclosed methods include hydrothermal growth techniques for the growth of differing layers on a host. A $YVO_4$ host material can be doped in one region with a suitable active lasing ion and can be formed with another region that is doped with a saturable absorber. Regions can be formed with controlled thickness. Following formation, a heterogeneous crystal can be cut, polished and coated with mirror films at each end for use in a laser cavity to provide short pulses of high power emissions using high frequency pulse modes.

20 Claims, 1 Drawing Sheet

(56) References Cited

U.S. PATENT DOCUMENTS

| | | | |
|---|---|---|---|
| 6,845,111 | B2 | 1/2005 | Sumida et al. |
| 6,944,196 | B2 | 9/2005 | Wittrock |
| 6,973,115 | B1 | 12/2005 | Ferrand et al. |
| 7,203,209 | B2 | 4/2007 | Young et al. |
| 7,211,234 | B2 | 5/2007 | Kolis et al. |
| 7,374,616 | B2 | 5/2008 | Kolis |
| 7,540,917 | B2 | 6/2009 | Kolis et al. |
| 7,563,320 | B2 | 7/2009 | Kolis et al. |
| 7,591,896 | B2 | 9/2009 | Kolis et al. |
| 7,731,795 | B2 | 6/2010 | Kolis et al. |
| 9,014,228 | B1 | 4/2015 | Kolis et al. |
| 2005/0226303 | A1 | 10/2005 | Suzudo et al. |
| 2007/0071059 | A1 | 3/2007 | Afzal et al. |
| 2007/0253453 | A1 | 11/2007 | Essaian et al. |
| 2009/0041067 | A1 | 2/2009 | Meissner et al. |
| 2009/0151621 | A1 | 6/2009 | Kolis et al. |
| 2010/0189619 | A1 | 7/2010 | Kolis et al. |

OTHER PUBLICATIONS

Degnan, "Optimization of Passively Q-Switched Lasers" *IEEE Journal of Quantum Electroic*, 31, 11, (1995) pp. 1890-1901.

Forbes et al., "The hydrothermal syntheseis, solubility and crystal growth of $YVO_4$ and $Nd:YVO_4$ ", *Journal Crystal Growth*, 310 (2008). pp. 4472-4476.

Feldman et al., "Dynamics of chromium ion valence transformations in Cr, Ca:YAG crystals used as laser gain and passive Q-switching media", *Optical Materials*, (2003), 24, pp. 333-344.

B. Ferrand, et al., "Liquie phase eiptaxy: A versatile technique for the development of miniature optical components in single crystal dielectric media", *Optical Materials*, 11 (1999), pp. 101-114.

Kolb, et al., "Phase Equilibria of $Y_3 Al_5 O_{12}$, and Hydrothermal Growth of $Gd_3 Ga_5 O_{12}$ and Hydrothermal Epitaxy of Magnetic Garnets" *Journal of Crystal Growth*, 29, (1975), pp. 29-39.

McDonald et al., "Reducing thermal lensing in diode•pumped laser rods", *Optics Communications*, (2000), 178, pp. 383-393.

Okhrimehuk, et al., "Performance of $YAG:Cr^{4+}$ laser crystal" *Optical Materials*, 3, (1994) pp. 1-13.

Song et al., Growth of composite sapphire/Ti:sapphire by the hydrothermal method, *J. Crystal Growth*, 277, (2005), pp, 200-204.

Zayhowski, "Microchip Lasers", *Optical Materials*, 11 (1999) pp. 255-267.

Zayhowski, "Q-switched microchip lagers find real-world application" *Laser Focus World*, Aug. (1999), pp. 129-136.

Mao et al., "High Efficient Laser Operation of the High-Doped Nd:YAG Crystal Grown by Temperature Gradient Technology", Chin.Phys.Lett. 19 (9), 2002, 1293-1295.

Huang et al., "Nd: YVO4 single crystal fiber growth by the LHPG method", J of Crystal Growth 229 (2001) 184-187.

HETEROGENEOUS SINGLE VANADATE BASED CRYSTALS FOR Q-SWITCHED LASERS AND MICROLASERS AND METHOD FOR FORMING SAME

CROSS REFERENCE TO RELATED APPLICATION

The present application is a divisional application of U.S. application Ser. No. 12/832,115 having a filing date of Jul. 8, 2010 now abandoned, which is incorporated herein in its entirety.

STATEMENT REGARDING FEDERALLY SPONSORED RESEARCH OR DEVELOPMENT

This invention was made with government support under Grant No. FA9550-07-1-0566 awarded by the United States Air Force/Air Force Office of Scientific Research and under Grant No. DMR 0907395 awarded by the National Science Foundation. The government has certain rights in the invention.

BACKGROUND

Typically, a solid state laser cavity contains a host material that is doped with a small amount of an activator ion. This ion can be pumped by a light source such as a flash lamp or more commonly, a diode laser of suitable frequency. The light from the pump is absorbed by the gain medium, i.e., the doped host, creating a population inversion that causes stimulated emission of coherent light. The output light can be in the form of continuous or pulsed emission.

While the gain medium can be the only crystal regime of a laser cavity, solid-state lasers often employ several single crystal regimes that serve a series of purposes. Typically these regimes occur in the form of a series of layers or films that have similar lattice structures and dimensions, but with slightly different chemical compositions where the different compositions reflect the different functions. For instance, some applications require a high-powered pulse. This can be achieved using relatively low pump power and a Q-switch employed in conjunction with the gain medium. Accordingly, short pulses of high power emissions using high frequency pulse modes can be provided.

Techniques of Q-switching encompass either active or passive methods. The active method provides excellent control but is quite complex. The passive mode is far simpler and requires only a suitable saturable absorber material, i.e., a Q-switch ion. The absorber material is a solid-state host doped with a minor amount of an ion that serves as passive trigger and is usually tailored to match the output light of the particular activator ion of the laser. Once light saturates the absorber, transmittance through the saturable absorber material rapidly increases (often referred to as "bleaching") and the absorbed energy is emitted from the laser cavity as a pulse of short duration with a high peak power.

This system is particularly suitable for diode pumped solid-state microlasers. A typical design employs a crystal doped with a suitable activator ion pumped with a modest powered diode laser and capable of emitting between about 10 and 100 mW. To obtain short bursts of higher peak powers of several kW for a few nanoseconds a passive saturable absorber Q-switch is utilized in conjunction with the emission material. Passive saturable absorber Q-switches have been previously described (see, e.g., U.S. Pat. No. 5,394,413 to Zayhowski). Attempts have been made to improve efficiency of such processes by minimizing optical loss between the emission of the gain medium and the absorption of the saturable absorber, for instance through utilization of certain dopant combinations such as $Nd^{3+}$ and $Cr^{4+}$ (see, e.g., Okhrimchuk, et al., *Opt. Mater.* 3 (1994) 1-13; Deanan, *IEEE J. Quantum Electron.* 31 (1995) 1890-1901; U.S. Pat. No. 5,119,382 to Kennedy, et al.).

Additional crystal regimes can be incorporated into a laser cavity including those to obtain thermal management, mechanical strength, waveguiding capabilities, and the like. Thermal management is a significant matter particularly with regard to high-energy solid-state lasers. For instance, thermal lensing and surface distortion become a significant matter for higher power applications during which residual heat buildup can be localized in the active lasing cavity in a non-uniform fashion. This leads to irregular thermal expansion of the lattice and reduces the quality of the beam. Many of these issues have been summarized in the technical literature (for example Armstrong et al. *Optics Comm.* 2000, 175, 201; McDonald et al. *Optics Comm.* 2000, 178, 383.), as well as the patent literature (see, e.g., U.S. Pat. No. 6,845,111 to Sumida, et al., U.S. Pat. No. 6,944,196 to Wittrock, and U.S. Pat. No. 5,761,233 to Bruesselbach, et al.). In thin disk lasers it is often desirable to have a thin layer region doped with activator ions on a thicker undoped region that serves a supporting substrate. Such devices have been described in e.g., U.S. Pat. No. 6,347,109 to Beach, et al. and U.S. Pat. No. 6,834,070 to L. E. Zapata.

In one design both the activator solid and the secondary function material, e.g., the Q-switch, are based on the same host and only differ in the particular ion doped into the host lattice. Since the dopant ion is often similar in size to the other metal ions in the lattice and is only present in small amounts (usually between 0.1 and 10%), the lattice size and structure is mostly unaffected.

In many applications the different regions are relatively small. For example a gain medium can be between about 0.5 mm and about 1.0 mm in thickness, while a Q-switching region can be between about 0.01 mm and about 0.5 mm in thickness. In addition to the crystal phases, the crystal surfaces can be coated with multiple dielectric films to control reflection and absorption, but these add little to the overall length of the laser cavity. Small size of the components can reduce the pulse width and lead to a very small, simple laser cavity that provides an output beam having a high repetition rate of high peak powers with short duration and single mode well-shaped pulses. These small, simple, rugged devices are called microlasers and have the advantages of modest input power but brief coherent high peak output. Microlasers are useful for various applications including range finding, optical communication, micromachining, environmental monitoring and many other applications (see, e.g., Zayhowski, *Opt. Mater.* 11 (1999) 255-267; Zayhowski, *Laser Focus World*, August 1999).

To create a solid-state laser cavity with multifunctionality, it is necessary to produce the various regions attached to one other through a robust and precise bonding mechanism. Construction is complicated by the need for very precise control of the concentration dopant ion and thickness of the layers. Furthermore, if the resultant output beam is to be frequency manipulated through a non-linear process (for example second harmonic generation or optical parametric oscillation), it is useful to have an output with controlled polarization. All of these requirements lead to the need for very exact control over the various layers in a solid-state device.

There are two general techniques presently in use to form multifunctional crystal devices. One method is direct bonding of different premade materials. Use of glues, fluxes or other bonding materials has been examined but is usually unacceptable due to degradation of the optical beam quality. Other direct bonding methods include pressure bonding, electrical potential fusion and other techniques, but these are often expensive, unreliable or otherwise not practical for scalable production of layers between 50-1000 microns (μm). Bonding methods have been described in, e.g., U.S. Pat. Nos. 5,441,803, 5,563,899, 5,846,638, 6,025,060 and U.S. Patent Application Publication No. 2009/0041067.

A second method has been the growth of layers directly on a suitable substrate to form a monolithic composite. Typically this has been accomplished through epitaxial growth in which one material acts as a substrate and a second material is deposited on the surface in a stepwise controlled manner. The grown layer adopts the general structural characteristics of the substrate (such as same lattice type and similar dimensions). Generally this process requires that the two materials have a similar structure type and reasonable crystal lattice match. In the case of solid-state laser devices, the use of gas phase epitaxial methods (molecular beam epitaxy, physical vapor deposition, MOCVD etc.) has not been suitable as gas phase methods are too slow to form the desired layer thickness (0.1-1 mm).

Liquid phase epitaxy (LPE) as described by B. Ferrand, et al. (see, e.g., *Opt. Mater.* 11 (1999) 101-114; U.S. Pat. No. 6,973,115; EP Patent No. EP-A-0 653-82) has also been used. LPE employs high temperature fluxes to dissolve the substrate material and deposit the appropriate layers on the substrate seed via supersaturation. It typically employs molten salts that are usually mixtures of lead oxide and boron oxide or other metal oxides that melt between 1200° C. and 1600° C. and impart modest solubility to the desired layer material. Unfortunately, the LPE method often utilizes highly toxic lead-based solvents and requires very high temperature processing, leading to increased environmental danger and costs. Additionally, the formed boule must be treated to spin away flux and cleaned with nitric acid to remove any residual flux. Furthermore, the high temperature solvents often contaminate the resultant product with the flux and/or impurities in the flux.

Hydrothermal techniques, in which a temperature differential is developed to create a supersaturated solution leading to crystal growth on a seed, have been utilized for bulk single crystal growth (see, e.g., R. A. Laudise, J. W. Nielson, *Solid State Phys.* 12 (1961) 149-222), but are not well known for use in forming heterogeneous materials. For example electronic grade quartz is grown commercially by the hydrothermal method. Other crystals, such as potassium titanyl phosphate (KTP) are grown by both flux and hydrothermal methods, and it is widely acknowledged by those familiar with the art that the hydrothermally grown products are of generally superior quality.

What are needed in the art are methods for forming solid state laser devices incorporating multiple crystal regimes that are more economical than previous methods. For example, a low temperature, facile process that can provide a monolithic heterogenous crystal including a Q-switch for use in a laser cavity would be of great benefit.

SUMMARY

According to one embodiment, disclosed is a method for forming a monolithic heterogeneous crystal that includes a Q-switch region. For instance, a method can include heating and pressurizing an aqueous solution held within a reactor to develop a temperature differential between a first zone of the reactor and a second zone of the reactor. The reactor can include a vanadate feedstock in the first zone and a vanadate seed crystal in the second zone. More specifically, the vanadate formed by the feedstock is the same vanadate as the vanadate of the seed crystal. The feedstock can include a source for a saturable absorber ion, i.e., a Q-switch ion. Upon heating and pressurizing the contents of the reactor, growth of a vanadate Q-switch crystal region can be initiated on the vanadate seed crystal to form a monolithic product crystal. Additionally, the composition of the Q-switch crystal region can differ from the composition of the seed crystal such that the monolithic product crystal is heterogeneous.

In one preferred embodiment, the vanadate seed crystal can be a $YVO_4$ seed crystal.

In addition, the product can include an activator ion. For instance, either the vanadate seed crystal can include an activator ion, or the feedstock can include a source for an activator ion. Other materials can be included in the feedstock as well, such as a source of an ion for balancing lattice charge of the Q-switch crystal region.

A method can include forming additional crystal regions on the Q-switch region. For instance, a new undoped crystal region can be formed on the Q-switch region. A new region can also be formed according to a hydrothermal growth method as disclosed herein.

Also disclosed is a monolithic heterogeneous crystal as may be formed according to disclosed methods. For instance, a crystal can include a first region and a second region immediately adjacent to one another, the first and second region including the same vanadate host material, but the composition of the first region can differ from the composition of the second region. One of the regions of the crystal can be a Q-switch region. In addition, the crystal can include an activator ion, either in the Q-switch region or in an adjacent region.

Also disclosed are products that can incorporate the disclosed heterogeneous vanadate based materials, such as microlasers.

BRIEF DESCRIPTION OF THE FIGURES

A full and enabling disclosure of the present subject matter, including the best mode thereof to one of ordinary skill in the art, is set forth more particularly in the remainder of the specification, including reference to the accompanying figures in which.

Figure 1:
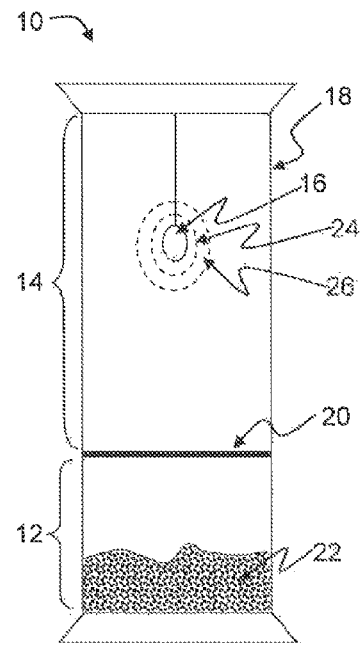
FIG. 1 is a schematic diagram of one embodiment of a hydrothermal growth system as described herein.

Repeat use of reference characters in the present specification and drawings is intended to represent the same or analogous features or elements of the present invention.

DETAILED DESCRIPTION

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made in the present disclosure without departing from the scope or spirit of the subject matter. For instance, features illustrated or described as part of one embodiment, may be used in another embodiment to yield a still further embodiment.

In general, disclosed herein are processes for manufacturing a heterogeneous crystal for use in a laser cavity and crystals formed according to the disclosed methods. A method can include a hydrothermal growth technique for the growth of differing epitaxial layers using a vanadate host material such as $YVO_4$ that can be doped in one region with a suitable active lasing ion such as $Nd^{3+}$ or $Yb^{3+}$ to form an emission region, and can be doped in another region with a suitable saturable absorber material, i.e., a Q-switch ion, such as $Cr^{4+}$ to form a Q-switch. Additional layers that can provide other functions such as, e.g., thermal control, waveguiding capabilities, and the like can also be included in a monolithic construct. Beneficially, a hydrothermal growth process can be used to grow and develop one or more regions of a vanadate based crystal with controlled thickness. Following formation, a heterogeneous crystal can be further processed as desired. For instance, a formed crystal can be cut, polished and coated with mirror films at each end for use in a microlaser cavity. While the present discussion is primarily concerned with formation of microlasers, it should be understood that the subject matter is not limited to a microlaser cavity application. Disclosed methods can also be utilized to form monolithic crystal structures that can act as a source for high-energy continuous wave laser cavities.

A vanadate laser crystal system has a number of unique properties, which can provide advantages over other types of systems. For example, a vanadate doped with $Nd^{3+}$ or $Yb^{3+}$ has a much greater absorption coefficient and a much broader absorption band than other hosts such garnets like YAG. This is particularly advantageous in the case of a diode pump source. Because the absorption band is broad and intense, there is less of a requirement to control the diode pump frequency than in other host systems like YAG. Also the emission cross section of the vanadates is larger than in YAG. In addition vanadates have a uniaxial tetragonal crystal lattice so the faces of the crystal can be oriented in the beam to have maximum absorption of polarized light (typically [100]) and emission of polarized beams. These properties make the vanadates a highly desirable host material and well suited for microlaser applications.

Unfortunately, there are also difficulties encountered when forming laser cavities based upon a vanadate. For instance, $YVO_4$ is generally more difficult to grow as bulk single crystals as compared to other more common materials, such as YAG. Also, it is somewhat fragile and susceptible to cracking along a plane normal to the c-axis. Additionally, there are few if any specific methods to perform LPE on vanadates. Several patents mention an extension of LPE growth on vanadates but provide no teaching or examples.

A hydrothermal epitaxial method as disclosed herein addresses all of these issues. A method can be performed at a modest temperature in an isothermal, low viscosity growth medium. Thus, it minimizes any thermal strain or inhomogeneities in a region of the crystal. It is possible to grow thin layers in a modestly thick substrate with no cracking. The growth rates are typically between 1-8 microns/hour, allowing for careful control of the film thickness. Since no pressure treatment or manual manipulation is required, the films can be much more mechanically robust.

A hydrothermal growth method can also eliminate the use of molten flux solutions as are needed for LPE. By eliminating the fluxes from the growth process, a number of steps can be saved including the need to spin away flux and clean the boules with nitric acid to remove any residual flux. Furthermore, the high temperature solvents utilized in LPE often contaminate the resultant product with impurities in the flux or the flux themselves. The fluxes also can induce cracking during the heat up cool down in the high temperature fluxes. A hydrothermal growth method eliminates the need for highly toxic lead-based solvents that are often the LPE solvents of choice in YAG growth methods.

FIG. 1 illustrates one embodiment of a hydrothermal system 10 as may be utilized in a process. In general, a hydrothermal process involves the use of a superheated aqueous solution (liquid heated above its boiling point) under pressure to cause transport of soluble species of a refractory oxide from a nutrient rich zone 12 to a supersaturated zone 14. As the refractory oxide is not sufficiently soluble in the superheated water, the species will crystallize, either spontaneously according to primary nucleation or alternatively on a seed crystal 16 located in the supersaturated zone 14.

A process can generally take place within a reactor 18. Depending on the chemical demands of the specific system, a reactor 18 can be lined with a noble metal such as silver, gold, platinum, palladium, etc. For instance, a liner can be either fixed liner or a floating liner. A fixed liner can encompass a reactor that is a stand alone autoclave that can carry the reactants, products, etc. A floating liner is generally a smaller reactor containing the reactants that can be held within a larger autoclave. For instance, an autoclave can contain one or more floating liners in the form of smaller tubes, e.g., silver tubes, each of which is loaded with reactants, water, seed crystals, etc. and each of which can function as a reactor within a larger autoclave. Other materials for formation of a reactor are generally known in the art and include, without limitation, metals, quartz, ceramics, Teflon®, and so forth.

A reactor 18 is generally sealable, as with a cold seal, and can be of any desirable size depending, for example, on whether a process utilizes a fixed or floating liner, the size of product crystal to be formed by the process, energy requirements (e.g., temperatures and temperature gradient during a process), and so forth. For instance, a stand alone autoclave reactor with either fixed liner or unlined can generally be between about 1 cm and about 10 cm in a cross sectional dimension and between about 4 cm and about 100 cm in height. A floating liner reactor can generally be smaller (though not necessarily so), for instance between about 0.25 cm and about 2 cm in diameter and between about 2.5 cm and about 10 cm in height. Of course, larger and smaller reactors are also encompassed herein.

A reactor 18 can include a baffle 20 between a nutrient rich zone 12 and a supersaturated zone 14. A baffle 20 can be formed of the same or different material as the wall of the reactor 18. For instance, when considering a silver lined or floating reactor 18, baffle 20 can also be silver or silver lined. Baffle 20 can include at least one hole therethrough for passage of solution from the nutrient rich zone 14 to the supersaturated zone 20. A baffle 20 can aid in maintaining a temperature differential between the two zones and can encourage substantially isothermal characteristics in each zone. Baffle 20 can also restrict convection flow between nutrient rich zone 14 and supersaturated zone 20 and can channel the convection flow across the baffle 20 into a desirable geometry.

System 10 can also include heaters, insulators, controllers, etc. as are generally known in the art (not shown on FIG. 1). For instance, a system 10 can include an air space between insulation and the reactor wall. There can also be vents at strategic places to allow air flow to be controlled. Changing vent parameters and power delivered to heaters can determine the thermodynamic condition of the reactor. Additionally, though illustrated in a vertical arrangement with the nutrient rich zone 14 below the supersaturated zone 20, this is not a requirement of the disclosed process, and the two zones can be located in any suitable location with regard to one another, as long as a temperature differential between the two can encourage convective flow there between.

According to one embodiment, a seed crystal 16 can be placed in the growth zone 14 to facilitate crystallization of a dissolved feedstock 22 from a supersaturated solution. In general, a seed crystal can be formed of a vanadate host material and can be a homogeneous or heterogeneous crystal. In one preferred embodiment, the host material can be $YVO_4$, but this disclosure is not restricted to only $YVO_4$. Many other formulations of the vanadate structural type can be utilized. For example $GdVO_4$ is a suitable laser host like its $YVO_4$ analog but it has much higher thermal conductivity, which is useful for high-energy applications to minimize thermal lensing. The various mixed combinations of trivalent lanthanides can also serve as a substrate and epitaxial mixed metal layers can be grown on these substrates using the same hydrothermal technique disclosed herein. These hosts can serve as the basis for laser cavities in solid-state lasers and microlasers by growing epitaxial layers using the hydrothermal methods. Laser device crystals based upon other vanadate host materials can be grown using similar hydrothermal epitaxial growth methods under approximately similar conditions of temperature pressure and mineralizer as discussed at further length herein with regard to $YVO_4$. In addition there are other metal vanadates with similar structure and general properties that are useful hosts such as, but not limited to, $GdVO_4$ and $LuVO_4$.

A seed crystal can be a synthetic or natural material and may be obtained according to any formation process as is generally known. For instance, a seed crystal can be grown from a melt according to a flux growth process, or alternatively cut from a larger crystal formed according to such a process or purchased on the retail market. A vanadate crystal can be cut and polished to a [100] orientation and hung as a seed crystal 16 in reactor 18.

A process can be carried out with a seed crystal 16 of any suitable size, the size being limited generally according to the diameter of the reactor 18. The seed crystal 16 can be fairly uniform in thickness. For instance, a seed crystal can be in any desired shape (rod, disc, sphere, ovoid, etc.) about 1 mm in diameter, about 1 cm in diameter, or larger, as desired.

Included in system 10 can be a feedstock 22 located in the nutrient rich zone 12 of reactor 18. An illustrative example of a process is one in which suitably doped $YVO_4$ feedstock 22 can be transported in hydrothermal fluids to a $YVO_4$ substrate seed crystal 16 to form a layer of doped $YVO_4$ 24 of appropriate thickness on the seed crystal 16.

A feedstock 22 can include the $YVO_4$ host material or sources for forming the host material a powdered form. According to one embodiment, a feedstock of powdered or microcrystalline $YVO_4$ mixed with the appropriate concentration of activator ion can be located in a reactor 18. One method for forming this feedstock is by melting appropriate starting oxides ($Y_2O_3$, $Nd_2O_3$ and $V_2O_5$ for example), in a platinum vessel in air in a sodium borate flux using well-established literature procedures (See, e.g., Phillips et. al. Am. Ceram. Soc. Bull. 46 (1967) 366; Elwell et. al. Crystal Growth from High Temperature Solutions, Academic Press 1975.) The borate flux can then be washed away leaving the feedstock as a granular or crystalline solid.

Included in the feedstock 22 can be one or more activator ions, e.g., $Nd^{3+}$ or $Yb^{3+}$ at a concentration of between about 0.1 atomic % (at. %) and about 10 at. % dopant for use as an emission regime in a laser cavity. Any suitable activator ion dopant as is known in the art can be used including essentially all of the suitable trivalent laser active ions and is not limited to $Nd^{3+}$ and $Yb^{3+}$. For instance, for operation of a Q-switched microlaser in the vicinity of about 2.0 μm wavelength, $YVO_4$ doped with $Tm^{3+}$ along with $Ho^{3+}$ can be utilized as a gain medium material. $Er^{3+}$ is another example of a dopant as may be included in a feedstock 22 for forming an activator region 24 on a seed crystal 16.

A dopant can generally be provided in a feedstock 22 in a concentration of between about 0.1% and about 10%. The concentration of a dopant in a crystal region can be controlled very precisely through the addition of appropriate starting materials as feedstock. This provides for the control of performance characteristics and lattice size. More specifically, by use of disclosed methods, dopant concentration can be maintained at a constant level throughout growth, rather than at an ever changing concentration throughout growth as in some flux methods. Thus, the formed crystal region can include the dopant at a constant level throughout the region, which can provide an improved lattice structure and performance.

The aqueous solution used in a hydrothermal process can include a mineralizer that can facilitate dissolution and transport of the feedstock. A mineralizer can include one or more small ionic species and can be added to the hydrothermal solution. Ions include but are not limited to $OH^-$, $CO_3^{2-}$, $F^-$, $Cl^-$, $NO_3^-$ and $H^+$ or concentrations thereof. Control of identity and concentration of a mineralizer can facilitate both the rate and quality of crystal growth. Mineralizers and parameters for their use are well known to those practiced in the art and have been used for the growth multiple electro-optic crystals such as KTP (see, e.g., U.S. Pat. No. 4,305,778 to Gier and U.S. Pat. No. 5,066,356 to Ferretti, et al., both of which are incorporated herein by reference).

The concentration of a mineralizer used in a process can vary, as is known. In general, mineralizer concentration can vary between about 1M and about 30M, or even higher in some embodiments. In one embodiment a modest concentration of between about 1M and about 2M of an alkali hydroxide can be utilized in forming a doped vanadate based layer (See Forbes et al. J. Cryst Growth (310) 2008, 4472).

During a process, a superheated hydrothermal fluid can be contained in a reactor under pressure, typically between about 5 kpsi and about 30 kpsi. Growth and supersaturation control is achieved in a process by the use of a differential temperature gradient across a reactor. Referring again to FIG. 1, a nutrient rich zone 12 can be heated and feedstock 22 can dissolve in the hot hydrothermal fluid. The solution in the nutrient rich zone 12 can become a saturated solution. The supersaturated zone 14 can be held at a slightly lower temperature. Consequently, the solution in the nutrient rich zone 12 can convect upward through the baffle 20 and into the supersaturated zone 14 where it will cool and become supersaturated. The dissolved feedstock can begin to come out of solution and build upon the crystal structure of the seed crystal 16. The process will continue until stopped or the feedstock supply is consumed.

A feedstock 22 of $YVO_4$ source materials doped with suitable concentration of activator ions of choice can be placed in the reactor 18 along with an aqueous phase containing an appropriate concentration of a suitable mineralizer. The reactor 18 can be sealed and a suitable temperature gradient can be established.

Among the advantages of a hydrothermal crystal growth process is the low operating temperatures. For instance, a growth process can generally be carried out at upper temperatures of between about 500° C. and about 650° C. in the dissolution zone, or between about 375° C. and about 620° C. in the growth zone, which can be 800° C. to 1200° C. lower than an LPE method. This can simplify operating conditions and drastically minimize the amount of thermal strain regions of a forming crystal. The thermal gradient between the two zones of a reactor can likewise vary according to specific materials and growth rates desired, but typically can be between about 20° C. and about 100° C.

The temperature gradient can be maintained for a length of time to deposit of an epitaxial layer 24 of $YVO_4$ that is doped with the selected amount of activator ion, e.g., $Yb^{3+}$ or $Nd^{3+}$. The doped material 24 can grow on the seed crystal 16 and can essentially be an identical part of the same crystal lattice as the substrate, distinguishable only by the dopant, e.g., $Nd^{3+}$ and/or $Yb^{3+}$ in the activator regime. For instance, the deposited layer 24 can adopt the same orientation as the seed (for example [100]) allowing for control of polarization of the resultant beam. This may be preferred in applications in which the laser radiation emitted by a device is desirably frequency converted using second harmonic generation or optical parametric oscillation (for example from 1064 nm to 532 nm light). In these cases it is highly desirable to have a cavity crystal that can emit polarized light for subsequent frequency conversion by an appropriate non-linear optical crystal (such as KTP, BBO, LBO etc). A preferred face in $YVO_4$ or other vanadates that can emit polarized light is the [100] face so it is desirable to grow the epitaxial layers on this [100] face. However, deposited layer 24 may optionally be grown on other seed faces and the resultant coherent light emission may be polarized for further manipulation.

In general, growth rate of a developing region can be between about 1 and about 5 microns per hour, or between about 30 and about 100 microns per day. The identity and concentration of a dopant typically has no effect on the rate of layer growth. Rather, the rate of crystal growth can be controlled by the identity and concentration of a mineralizer as well as the temperature gradient across the reactor and the nature of the host material. A relatively slow growth rate can be beneficial as this can allow for precise control of the thickness of the forming crystal. For example, a process can reliably grow a region at about 1 to about 2 microns/hour or about 25 to about 40 microns/day and can thus be used to grow a region of about 100 to about 150 microns over four days. Generally, preferred growth conditions for any specific system can be specific to the particular host lattice, as is known in the art.

Following formation of an activator region 24, a second layer 26 of a material can be formed based upon the same host material and doped with a suitable absorbable activator so as to form a Q-switch. Accordingly, a process can be carried out a second time in which the seed crystal can be the heterogeneous crystal previously formed including region 16 and activator region 24. A feedstock can include a source for the vanadate host material as well as the desired saturable absorber material for forming a Q-switch region.

In one embodiment, activator region 24 can include a $YVO_4$ host material doped with an activator ion such as $Nd^{3+}$ or $Yb^{3+}$. These two ions emit in the 1.03-1.06 $\square$m region, which is a suitable region for $Cr^{4+}$ to act as a saturable absorber. Thus, the feedstock for forming Q-switch region 26 can include a source for $Cr^{4+}$ dopant, including, without limitation $CrO_2$ $Cr(NO_3)_3$, $CrCl_3$, and so forth. The $Cr^{4+}$ ion can be doped into the $YVO_4$ lattice with the use of an equimolar amount of a charge compensation ion. In $YVO_4$ the $V^{5+}$ ion is in an approximate four coordinate tetrahedral-like coordination environment making it suitable for substitution by $Cr^{4+}$ to behave as a saturable absorber. If the $Cr^{4+}$ displaces $V^{5+}$, an optically benign tetravalent ion such as $Zr^{4+}$ or $Hf^{4+}$ could be added to replace $Y^{3+}$ as a charge compensator. $Zr^{4+}$ is especially suitable since it can adopt the 8-coordinate environment of the $Y^{3+}$ it is replacing. Any of these appropriate dopants can be included in the feedstock, either in the form of oxide, halide nitrate or other related source. They are mineralized in the same manner as the actual host material and readily incorporate into the host lattice.

Alternatively, Cr ion can be introduced as $Cr^{3+}$ directly into the lattice and then converted into the suitable $Cr^{4+}$ in a tetrahedral coordination site. For instance, an oxidant may be added to the hydrothermal solution. Suitable oxidants can include, without limitation, $NO_3^-$ or $H_2O_2$, for example. Alternatively, a trivalent Cr source can be converted by controlled heated after growth (see, e.g., Feldman et al., *Optical Materials* 2003, 24, 333-344.) This is a relatively simple process in that $Cr^{3+}$ is the most stable oxidation state under growth conditions so it can be added by simply including the appropriate amount of a soluble $Cr^{3+}$ source (for example $CrCl_3$) into the feedstock. Once the Cr ion is included in the lattice it can be converted to the suitable $Cr^{4+}$ material using methods as are generally known in the art.

Disclosed methods can be readily scaled to large numbers of samples simultaneously so time is not a hindering factor. Moreover, once a process is started it can require no operator input over the course of the reaction and can be replicated reliably many times. As such, the total time of growth can be of little consequence in the overall production process.

A process can be a simple single step process and can deposit regions of various shapes such as rods or disks. Typically formed regions can be several hundred microns to several millimeters thick, though larger or smaller materials can be formed.

Figure 2:
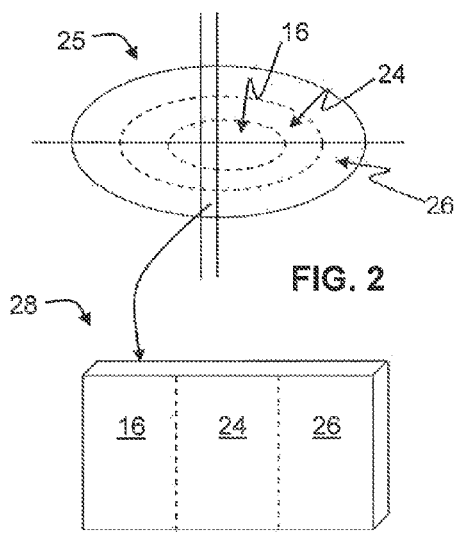
FIG. 2 is a schematic diagram of one embodiment of a method for forming a cut heterogeneous single crystal as described herein.

FIG. 2 illustrates one embodiment of a heterogeneous as-formed crystal 25 including $YVO_4$ undoped core 16, a $YVO_4$-based activator crystal region 24 and Q-switch region 26. Product crystal 25 can be a large area substrate that can be polished and processed using techniques well known to those in the art. For example, a crystal 25 can be cut as shown by the dashed lines to form a final product crystal 28 including gain medium 16 for use in a laser cavity. In one embodiment, crystal 28 can be polished and coated with appropriate reflective coatings and cut into many pieces to form a large number of microlaser cavity devices. The end result can be a laser cavity crystal 28 that is a compact rugged monolithic single crystal microlaser with high peak powers.

Figure 3:
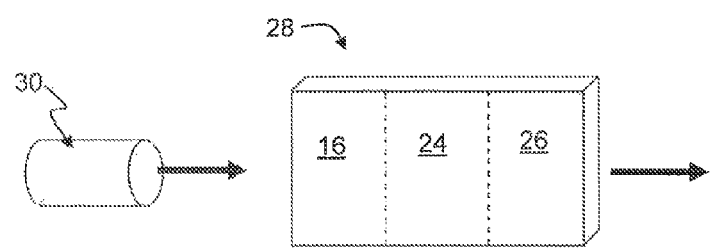
FIG. 3 is one embodiment of a laser system incorporating a heterogeneous monolithic crystal as described herein.

As illustrated in FIG. 3, during use, a light source 30 such as a flash lamp or diode laser can pump light into crystal 28, including and end cap 16, an emission region 24 and Q-switch region 26. Once light saturates the absorber of the Q-switch 26, transmittance through the saturable absorber material rapidly increases (often referred to as "bleaching") and the absorbed energy is emitted from the emission region 16 as a pulse with a high peak power.

According to another embodiment both the activator ion and the Q-switch dopant ions can be provided in the same region of a heterogeneous crystal. In this embodiment, the dopant ions (such as $Nd^{3+}$ for example, Q-switch ions (such as $Cr^{4+}$ for example) and counterbalancing charge ions (such as $Zr^{4+}$ for example) can all be placed in the feedstock mixed with $YVO_4$ feedstock. Using the same transport conditions and mineralizers as described above, an epitaxial layer including a mixture of all the dopant ions can be grown on a suitable undoped $YVO_4$ single crystal seed to form one multifunctional layer grown on the substrate.

It should be noted that doped heterogeneous $YVO_4$ can also act as a microlaser or thin disk laser under the invention conditions described here and can use an external Q-switch device such as a second external crystal off $Cr^{4+}$ doped YAG for example (see for example Kalisky et al Optical Materials 30 (2008) 1775). A multi-domain, multifunctional single crystal with both activator ion and Q-switch ion in the same crystal is only the most compact version of the invention but does not limit the use of activator doped YVO4 as the laser cavity.

One advantage of disclosed methods is that they can be simply and economically scaled to large volume production. A hydrothermal epitaxial growth method can be utilized to grow crystal regions on very large area substrates limited only by the inner diameter of the reactor. If a reasonably large boule is used as a seed (e.g., about 1 to about 2 inches), the formed heterogeneous product can be cut into multiple microlaser cavity crystals making this process an extremely cost effective one. For example, an original seed crystal with 25×25 millimeter dimension (or 625 mm² surface area) can produce in excess of 400 microlaser chips with 2×2 millimeter dimensions (allowing for edge defects and kerf loss) after only a few days of hydrothermal layer growth. Since the volume of each particular run is limited only by the dimensions of the seed and the inner diameter of the reactor, the ability to scale production to large volumes of devices is readily apparent. A hydrothermal process can provide very uniform, homogeneous and monolithic layer growth for each region because each layer can be grown out of highly mobile and homogenous soluble growth solution, and thus can be used to reliable develop large heterogeneous monolithic crystals.

A hydrothermal growth method as disclosed herein can be utilized in forming additional regimes on a single structure, in addition to activator and Q-switch regimes as described above. Specifically, any number of desired layers can be grown successively on previous layers.

For instance, a layer of undoped $YVO_4$ can be functional in thermal control of a laser cavity. According to this embodiment, a layer of a $YVO_4$ material doped with an activator ion can be grown on undoped $YVO_4$ seed crystal. Following, a second layer of a $YVO_4$ material doped with saturable absorber can be formed on the first layer, and finally another layer of undoped $YVO_4$ can be formed on the Q-switch. This hydrothermal epitaxial growth technique can be used to prepare a $YVO_4$ crystal with undoped end caps specifically designed for high-energy applications and very high peak pulse power.

A primary problem for high-energy applications is the issue of thermal lensing. At pump powers above 2 W thermal lensing effects begin to occur. In this case, the excess heat of the intense pump power begins to distort the lattice containing the absorbing gain ions. As the lattice distorts, it not only affects the beam quality but more significantly it can crack the thin dielectric coating layers. Thus for high-energy applications it may be desirable to add a relatively thick layer of undoped host material after the Q-switching layer is grown but before the dielectric coating is applied. Such a configuration allows for much higher pumping powers by minimizing thermal lensing and protecting the thin entry and exit films from lattice distortions that now happen away from the thing coatings. Such a crystal can serve as a laser cavity for very high pump powers (e.g., about 2 to about 100 W) creating pulse lasers emissions with extremely high peak power.

Additional layers can likewise be formed on a $YVO_4$-based substrate. For instance, a single layer of an undoped $YVO_4$ host material can be formed for strength or for connection to a heat sink.

Thus, a series of multiply doped composite crystal regions can be prepared with numerous layers each differing from one another with regard to presence or absence of doping ion, type or concentration of doping ion, combination of dopants, etc., to perform a specific function. For example, a single $YVO_4$ heterogeneous crystal can be prepared that contains adjacent regions doped with $Ho^{3+}$, $Cr^{4+}$, $Tm^{3+}$, and no dopant, successively.

In one embodiment, additional layers can be grown in a separate reactor following formation of a previous layer to prevent any contamination from the dopant in adjacent layers, though this is not a requirement of disclosed processes. Thus, in this embodiment, the seed crystal of the additional process can be a heterogeneous, monolithic crystal formed in a previous process.

Dopants for a region of a crystal are not limited to any particular ions described as examples herein. In general, the preferred identity of a dopant can depend upon the desired function of the region and the vanadate host material in the feedstock. For instance, in addition to $Nd^{3+}$ and $Yb^{3+}$, suitable activator ion dopants can include, without limitation, $Er^{3+}$, $Tm^{3+}$, $Ho^{3+}$, and the like. In general, all trivalent lanthanides (La to Yb, Sc and Y) and most other trivalent transition metal ions (e.g., $Cr^{3+}$, $Fe^{3+}$) can be successfully doped into a vanadate lattice using a hydrothermal growth method. Typically, all the rare earths from Ce to Yb can be incorporated into a host metal site as a dopant. Moreover, a region can include more than one dopant. For instance, a region can be formed of $Yb,Er:YVO_4$ or $Tm,Ho:YVO_4$. Most dopants can be provided to the feedstock as a metal oxide, halide, or nitrate.

Any element in a host lattice can be varied according to disclosed methods, as desired. For instance, elements of a host lattice can be varied to adjust the refractive index and overall lattice size. Materials can be introduced to a region using appropriate sources in the feedstock (typically the dopant oxide, but occasionally the halide or nitrate salt). Other metal ions can be introduced as required by the desired function of the formed crystal regime. In one embodiment, a dopant ion can replace an optically inactive ion with a different charge. In such an embodiment another ion may also be introduced simultaneously to balance the charge in the lattice, as is generally known in the art.

Beneficially, through utilization of a hydrothermal growth method, higher concentrations of dopants can be incorporated in a region than is possible using conventional melt growth techniques. For instance, $Nd^{3+}$ dopant can be incorporated in a host at levels greater than about 2 at. %, or up to about 5 at. %, or up to about 10 at. %, or between about 2 at. % and about 10 at. %, which is much higher than the 1.5 at. % doping level available when utilizing a melt formation process. Of course, lower dopant concentrations are also encompassed herein. For instance, a dopant can be provided in a host material at a concentration between about 0.1% and about 10%. Larger dopant ion concentrations in a region is also encompassed. For example, a region can include about 50% dopant in $YVO_4$ host, such as an erbium dopant.

The present disclosure may be better understood with reference to the following prophetic examples.

Prophetic Example 1

A single crystal boule of $YVO_4$ about 2 mm to about 4 mm thick and about 1 square centimeter in size can be formed using hydrothermal bulk crystal growth techniques (see: U.S. Pat. No. 7,211,234, previously incorporated herein by reference) or obtained by any other suitable method. This piece is used as the seed crystal or substrate for the hydrothermal deposition of a layer of $Nd:YVO_4$. The substrate is suspended on a ladder or frame near the top of an autoclave lined with an inert noble metal (gold, silver or platinum). The feedstock material is placed in the bottom of the autoclave and can include some combination of $YVO_4$, $Y_2O_3$, $V_2O_5$ (or other vanadates species such as sodium vanadate, etc.), $YO(OH)$, $Y(OH)_3$ and the $Nd^{+3}$ source ($NdCl_3$, $Nd(NO_3)_3$, etc.) NaOH and deionized water is also added to the autoclave to produce an aqueous hydroxide mineralizer solution typically in about 1M to about 3M concentration. The autoclave is then sealed and heated using independent band heaters to control the temperatures of the nutrient rich zone (containing the feedstock) and the supersaturated zone (containing the seed crystals) and establish a solubility difference between the two zones. For growth of a $Ndr:YVO_4$ epitaxial layer on a $YVO_4$ substrate, the nutrient rich zone is typically heated to about 450° C. and the growth zone temperature is held at about 400° C. (though the process is not limited specifically to these temperatures and this temperature gradient). Using this configuration, the $Nd:YVO_4$ layer will be deposited onto the substrate at an approximate rate of 100 microns per day. This temperature configuration is maintained for about 7 to 15 days, depending on the desired thickness of the layer. After this growth period the autoclave is cooled to room temperature and the monolithic crystal is harvested. The outer surfaces of the crystal should be polished to remove any extraneous material (typically only a few microns thick) that was deposited during the cool-down process.

The resulting crystal can be cut lengthwise along the center of the edge of the crystal to produce two separate crystals that is each a monolithic laser crystal comprised of a $YVO_4$ substrate coated with an epitaxial layer of $Nd:YVO_4$. This crystal can then be heat treated, fabricated and polished as needed to meet the specifications of the laser device.

Prior to cutting, a layer of undoped $YVO_4$ can be grown on top of the $Nd:YVO_4$ layer in the same fashion described above to serve as an endcap. This is done in a separate autoclave using a feedstock comprised purely of $YVO_4$ to prevent any contamination from the dopant in this outermost layer.

Prophetic Example 2

A single crystal boule of $Nd:YVO_4$ about 2 mm to about 4 mm thick and about 1 square centimeter in size can be formed using hydrothermal bulk crystal growth techniques (see: U.S. Pat. No. 7,211,234, previously incorporated herein by reference) or obtained by any other suitable method. This piece is used as the seed crystal or substrate for the hydrothermal deposition of a layer of $Cr:YVO_4$. The substrate is suspended on a ladder or frame near the top of an autoclave lined with an inert noble metal (gold, silver or platinum). The feedstock material is placed in the bottom of the autoclave and can include of some combination of $YVO_4$, $Y_2O_3$, $V_2O_5$ (or other vanadates species such as sodium vanadate, etc.), $YO(OH)$, $Y(OH)_3$ and the chromium source ($CrCl_3$, $Cr(NO_3)_3$, $CrO_2$, etc.) and charge balancing ions (such as $ZrO_2$, for example) in the desired ratio. NaOH and deionized water is also added to the autoclave to produce an aqueous hydroxide mineralizer solution typically in about 1M to about 3M concentration. The autoclave is then sealed and heated using independent band heaters to control the temperatures of the nutrient rich zone (containing the feedstock) and the supersaturated zone (containing the seed crystals) and establish a solubility difference between the two zones. For growth of a $Cr:YVO_4$ layer on a $Nd:YVO_4$ substrate, the nutrient rich zone is typically heated to about 450° C. and the growth zone temperature is held at about 400° C. (though the process is not limited specifically to these temperatures and this temperature gradient). Using this configuration, the $Cr:YVO_4$ layer will be deposited onto the substrate at an approximate rate of 100 microns per day. This temperature configuration is maintained for about 2 to 7 days, depending on the desired thickness of the layer. After this growth period the autoclave is cooled to room temperature and the monolithic crystal is harvested. The outer surfaces of the crystal should be polished to remove any extraneous material (typically only a few microns thick) that was deposited during the cool-down process.

The resulting crystal can be cut lengthwise along the center of the edge of the crystal to produce two separate crystals that is each a monolithic laser crystal comprised of a $Nd:YVO_4$ substrate coated with an epitaxial layer of $Cr:YVO_4$. This crystal can then be heat treated, fabricated and polished as needed to meet the specifications of the laser device.

Prior to cutting, a layer of undoped $YVO_4$ can be grown on top of the $Cr:YVO_4$ layer in the same fashion described above to serve as an endcap. This is done in a separate autoclave using a feedstock comprised purely of $YVO_4$ to prevent any contamination from the dopant in this outermost layer.

While certain embodiments of the disclosed subject matter have been described using specific terms, such description is for illustrative purposes only, and it is to be understood that changes and variations may be made without departing from the spirit or scope of the subject matter.

What is claimed is:

1. A method for forming a monolithic heterogeneous crystal comprising heating and pressurizing an aqueous solution held within a reactor to develop a temperature differential between a first zone of the reactor and a second zone of the reactor, the reactor containing a vanadate forming feedstock in the first zone and a vanadate seed crystal in the second zone, the feedstock forming the same vanadate as the vanadate of the seed crystal, the feedstock including a source for a saturable absorber ion, wherein upon said heating and pressurizing growth of a vanadate Q-switch crystal region is initiated on the vanadate seed crystal to form a monolithic vanadate product crystal, the composition of the Q-switch crystal region differing from the composition of the seed crystal such that the monolithic vanadate product crystal is heterogeneous.

2. The method according to claim 1, the aqueous solution comprising a mineralizer.

3. The method according to claim 1, wherein the vanadate is $YVO_4$.

4. The method according to claim 1, one of the vanadate seed crystal and the Q-switch crystal region comprising an active lasing ion dopant.

5. The method according to claim 4, wherein one of the vanadate seed crystal and the Q-switch regions comprises an active lasing ion at a concentration of greater than about 2 at. % of the vanadate host material of that region.

6. The method according to claim 4, wherein the active lasing ion is $Nd^{3+}$ or $Yb^{3+}$.

7. The method according to claim 1, the feedstock further comprising a source for an active lasing ion dopant.

8. The method according to claim 1, the feedstock further comprising a source for an ion for balancing lattice charge of the Q-switch crystal region.

9. The method according to claim 1, wherein the seed crystal is a heterogeneous monolithic crystal.

10. The method according to claim 1, wherein the seed crystal comprises a region of the vanadate that is undoped.

11. The method according to claim 1, wherein the reactor comprises an inert metal liner.

12. The method according to claim 1, wherein the aqueous solution is pressurized to a pressure of between about 5 kpsi and about 30 kpsi.

13. The method according to claim 1, wherein the temperature of the second zone is between about 450° C. and about 650° C.

14. The method according to claim 1, wherein the temperature difference is between about 20° C. and about 100° C.

15. The method according to claim 1, further comprising cutting and polishing the monolithic heterogeneous product to form a smaller heterogeneous monolithic crystal.

16. The method according to claim 1, further comprising forming a third crystal region on the Q-switch region, the third crystal region differing in composition from the Q-switch region.

17. The method according to claim 16, wherein the third crystal region comprises undoped vanadate.

18. The method according to claim 16, wherein the third crystal region is formed according to a method comprising heating and pressurizing an aqueous solution held within a second reactor to develop a temperature differential between a first zone of the second reactor and a second zone of the second reactor, the second reactor containing a vanadate forming feedstock in the first zone, this vanadate forming feedstock forming the same vanadate as the vanadate of the monolithic vanadate product crystal, the second reactor containing the vanadate product crystal in the second zone, wherein upon said heating and pressurizing growth of the third crystal region is initiated on the vanadate product crystal.

19. The method according to claim 1, wherein the saturable absorber ion is included in the feedstock in a concentration between about 0.01 at. % and about 10 at. %.

20. The method according to claim 1, the Q-switch region comprising an ion to balance the lattice charge of the Q-switch region.

* * * * *